(12) United States Patent
Suzuki et al.

(10) Patent No.: US 11,251,137 B2
(45) Date of Patent: Feb. 15, 2022

(54) SEMICONDUCTOR DEVICE

(71) Applicant: ABLIC Inc., Chiba (JP)

(72) Inventors: Satoshi Suzuki, Chiba (JP); Yoshitaka Kimura, Chiba (JP)

(73) Assignee: ABLIC INC., Chiba (JP)

( * ) Notice: Subject to any disclaimer, the term of this patent is extended or adjusted under 35 U.S.C. 154(b) by 69 days.

(21) Appl. No.: 16/791,586

(22) Filed: Feb. 14, 2020

(65) Prior Publication Data
US 2020/0266154 A1 Aug. 20, 2020

(30) Foreign Application Priority Data

Feb. 18, 2019 (JP) .............................. JP2019-026274

(51) Int. Cl.
*H01L 23/495* (2006.01)
*H01L 23/31* (2006.01)
*H01L 23/00* (2006.01)

(52) U.S. Cl.
CPC ........ *H01L 23/562* (2013.01); *H01L 23/3114* (2013.01); *H01L 23/4952* (2013.01); *H01L 23/49513* (2013.01)

(58) Field of Classification Search
CPC ............... H01L 23/562; H01L 23/4952; H01L 23/49513; H01L 23/3114; H01L 23/3107; H01L 2924/181; H01L 2224/48091; H01L 23/49548
See application file for complete search history.

(56) References Cited

U.S. PATENT DOCUMENTS

| | | | |
|---|---|---|---|
| 2002/0149097 A1* | 10/2002 | Lee | H01L 25/0652 257/686 |
| 2012/0126399 A1* | 5/2012 | Lin | H01L 24/82 257/737 |
| 2012/0235751 A1 | 9/2012 | Ueda | |
| 2020/0020613 A1* | 1/2020 | Kim | H01L 25/0657 |

FOREIGN PATENT DOCUMENTS

JP 2012-195454 10/2012

* cited by examiner

*Primary Examiner* — Edward Chin
(74) *Attorney, Agent, or Firm* — Crowell & Moring LLP

(57) ABSTRACT

A semiconductor device includes a lead frame having a die pad; a semiconductor chip having a front surface in which an integrated circuit is formed, and a back surface that is die-bonded onto the die pad through intermediation of an interposing film and an adhesive layer; and an encapsulating resin for encapsulating the lead frame, the adhesive layer, the interposing film, and the semiconductor chip. The interposing film has a first opening which forms a space between a part of the back surface of the semiconductor chip and the adhesive layer.

14 Claims, 3 Drawing Sheets

SEMICONDUCTOR DEVICE

RELATED APPLICATIONS

This application claims priority to Japanese Patent Application No. 2019-026274 filed on Feb. 18, 2019, the entire content of which is incorporated herein by reference.

BACKGROUND OF THE INVENTION

1. Field of the Invention

The present invention relates to a semiconductor device, and more particularly, to a semiconductor device including a lead frame, a semiconductor chip mounted on a die pad of the lead frame, and an encapsulating resin.

2. Description of the Related Art

In general, a semiconductor device is formed by mounting a semiconductor chip, which is individualized by dicing, onto a die pad of a lead frame through intermediation of thermosetting resin paste, connecting a bonding pad formed on the semiconductor chip with a lead of the lead frame by wire bonding, and then performing resin encapsulation (package assembling). In each process of the package assembling, physical connection between materials are carried out at high temperature. Because of the difference in linear expansion coefficient of each of the lead frame, the semiconductor chip, and the encapsulating resin, distortion occurs during return to normal temperature, and stress (package stress) is applied to the semiconductor chip.

Large stress applied to the integrated circuit which is formed on a front surface of the semiconductor chip causes variation (shift) in the characteristic values of the integrated circuit from the characteristic values obtained in a wafer state due to the stress. As a result, characteristic values of the semiconductor device may vary. It is therefore desired to reduce the absolute value of the package stress which may induce variation in the characteristic values.

In a conventional semiconductor device, there has been known a method of preventing variation of an output signal by forming the die pad on which the semiconductor chip is mounted smaller than the semiconductor chip in plan view so that the distribution of the package stress applied to the surface of the semiconductor chip becomes uniform (see, for example, Japanese Patent Application Laid-open No. 2012-195454).

However, in the conventional method described in Japanese Patent Application Laid-open No. 2012-195454, a uniform stress distribution can be achieved, but the magnitude of the stress itself cannot be decreased. It cannot be said that the stress is sufficiently reduced particularly for a semiconductor device in which the integrated circuit formed on the semiconductor chip includes an element such as a semiconductor sensor or a circuit section that is sensitive to stress.

SUMMARY OF THE INVENTION

In view of the above, the present invention has an object to provide a semiconductor device capable of reducing package stress.

A semiconductor device according to an embodiment of the present invention includes a lead frame having a die pad; a semiconductor chip having a front surface in which an integrated circuit is formed, and a back surface that is die-bonded onto the die pad through intermediation of an interposing film and an adhesive layer; and an encapsulating resin (106) for encapsulating the lead frame, the adhesive layer, the interposing film, and the semiconductor chip. The interposing film has a first opening which forms a space between a part of the back surface of the semiconductor chip and the adhesive layer.

According to the present invention, a space is formed above a part of the back surface of the semiconductor chip, and hence stress can be released by the space, also reducing the package stress.

BRIEF DESCRIPTION OF THE DRAWINGS

FIG. 1A, FIG. 1B, and FIG. 1C are views for illustrating a semiconductor device according to a first embodiment of the present invention, in which FIG. 1A is a schematic sectional view for illustrating the semiconductor device, FIG. 1B is a plan view for illustrating a front surface side of a semiconductor chip in the semiconductor device illustrated in FIG. 1A, and FIG. 1C is a plan view for illustrating a back surface side of the semiconductor chip in the semiconductor device illustrated in FIG. 1A.

FIG. 2A, FIG. 2B, and FIG. 2C are views for illustrating a semiconductor device according to a second embodiment of the present invention, in which FIG. 2A is a schematic sectional view for illustrating the semiconductor device, FIG. 2B is a plan view for illustrating a front surface side of a semiconductor chip in the semiconductor device illustrated in FIG. 2A, and FIG. 2C is a plan view for illustrating a back surface side of the semiconductor chip in the semiconductor device illustrated in FIG. 2A.

FIG. 3A, FIG. 3B, and FIG. 3C are views for illustrating a semiconductor device according to a third embodiment of the present invention, in which FIG. 3A is a schematic sectional view for illustrating the semiconductor device, FIG. 3B is a plan view for illustrating a front surface side of a semiconductor chip in the semiconductor device illustrated in FIG. 3A, and FIG. 3C is a plan view for illustrating a back surface side of the semiconductor chip in the semiconductor device illustrated in FIG. 3A.

DETAILED DESCRIPTION OF THE PREFERRED EMBODIMENTS

Embodiments of the present invention are described in detail with reference to the accompanying drawings.

First Embodiment

Figure 1A:
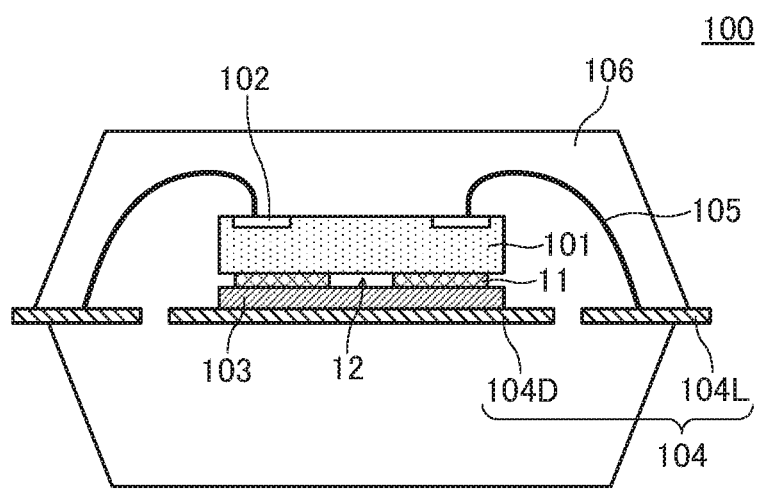
Figure 1B:
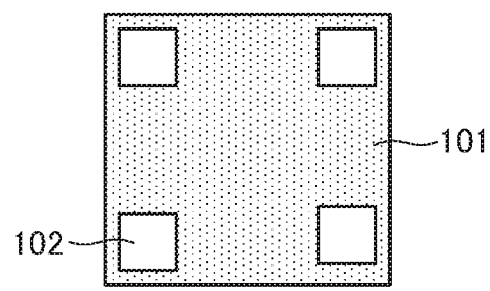
Figure 1C:
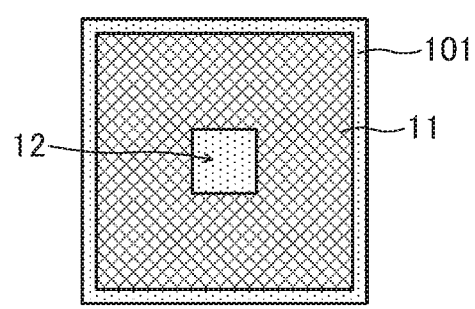

FIG. 1A to FIG. 1C are views for illustrating a semiconductor device 100 according to the first embodiment of the present invention. FIG. 1A is a schematic sectional view for illustrating the semiconductor device 100, FIG. 1B is a plan view for illustrating a front surface side of a semiconductor chip 101 in the semiconductor device 100 illustrated in FIG. 1A, and FIG. 1C is a plan view for illustrating a back surface side of the semiconductor chip 101 in the semiconductor device 100 illustrated in FIG. 1A.

As illustrated in FIG. 1A, the semiconductor device 100 according to the first embodiment includes a lead frame 104 including a die pad 104D and a lead 104L, the semiconductor chip 101 formed on the die pad 104D through intermediation of a die attach film 103 serving as an adhesive layer and an interposing film 11, a bonding wire 105 connecting the lead 104L to a bonding pad 102 that is formed on the front surface of the semiconductor chip 101, and an encapsulating resin 106 for encapsulating the lead frame 104, the die attach film (adhesive layer) 103, the interposing film 11, the semiconductor chip 101, and the bonding wire 105.

On the front surface of the semiconductor chip 101, in addition to the bonding pad 102 illustrated in FIG. 1A and FIG. 1B, an integrated circuit (not shown) is formed.

On the rear surface of the semiconductor chip 101, as illustrated in FIG. 1A and FIG. 1C, the interposing film 11 is formed, and the interposing film 11 has an opening 12 formed to expose a part of the back surface of the semiconductor chip 101.

After the die attach film 103 is bonded onto the die pad 104D of the lead frame 104, the semiconductor chip 101 is die-bonded onto the die pad 104D through adhesion of the interposing film 11 formed on the back surface of the semiconductor chip 101 to an upper surface of the die attach film 103.

With this configuration, the opening 12 formed in the interposing film 11 remains as a space between a part of the back surface of the semiconductor chip 101 and the die attach film 103. Stress can thus be released by the opening (space) 12. Further, in the opening (space) 12, the semiconductor chip 101 does not contact to the die attach film 103, and hence firm adhesion between the semiconductor chip 101 and the die pad 104D can be suppressed. In this manner, package stress can be reduced, and characteristic value variation of the semiconductor device 100 can be suppressed.

As described above in the conventional method, the semiconductor chip is generally die-bonded onto the die pad of the lead frame through intermediation of thermosetting resin paste. Further, the die attach film is generally used to laminate the semiconductor chips. However, in the first embodiment, the die attach film is used not for laminating the semiconductor chip 101 but for die-bonding the semiconductor chip 101 onto the die pad 104D as an adhesive layer.

In the first embodiment, if die-bonding is performed with use of resin paste as in the conventional method in place of the die attach film 103, the resin paste enters the opening 12 of the interposing film 11, and hence no space is formed. Further, since the semiconductor chip 101 adheres to the die pad 104D firmly, stress cannot be released, and the stress is transmitted to the semiconductor chip 101.

In contrast, according to the first embodiment, die-bonding is performed with use of the die attach film 103. With this configuration, the opening 12 formed in the interposing film 11 can be left as a space between a part of the back surface of the semiconductor chip 101 and the die attach film 103. In this manner, as described above, stress can be reduced. Further, the die attach film 103 is flexible, and hence there can also be obtained an effect that the die attach film 103 itself functions to relax the stress.

The interposing film 11 is preferred to be formed of, for example, polyimide, a silicon oxide film, a silicon nitride film, an alloy containing aluminum as a main component, copper, or polysilicon. When those films are used, the interposing film 11 having the opening 12 can be formed without using a special technology and can be formed by a general semiconductor manufacturing process using a depositing technology such as CVD or sputtering, a photolithography technology, and an etching technology. Particularly in a case in which a TEOS oxide film formed by plasma CVD is used as the interposing film 11, film stress can be adjusted in a direction of relaxing stress concentration in the TEOS oxide film formation. When the interposing film 11 is excessively thin, the die attach film 103 may enter the opening 12 due to its flexibility, and the die attach film 103 may adhere to the back surface of the semiconductor chip 101. When the interposing film 11 is excessively thick, the load on the manufacturing process increases. The thickness is therefore preferred to be about 0.1 to 10 µm.

In the first embodiment, an example in which the opening 12 is formed in the interposing film 11 substantially at the center of the back surface of the semiconductor chip 101 (see FIG. 1A and FIG. 1C) is described. The position of the opening 12 is, however, not necessarily need to be substantially at the center of the back surface of the semiconductor chip 101. The opening 12 may be formed at a position where stress is liable to concentrate.

Second Embodiment

Figure 2A:
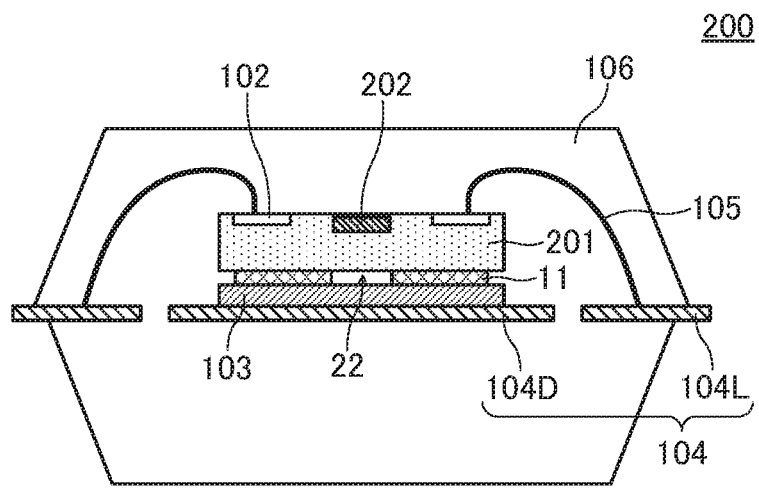
Figure 2B:
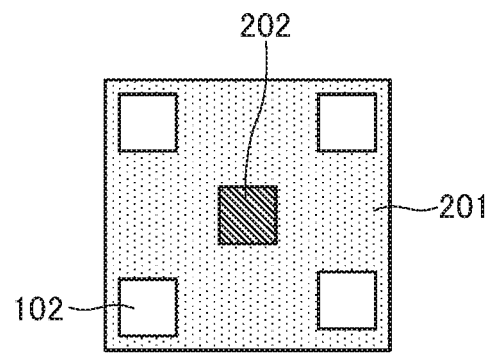
Figure 2C:
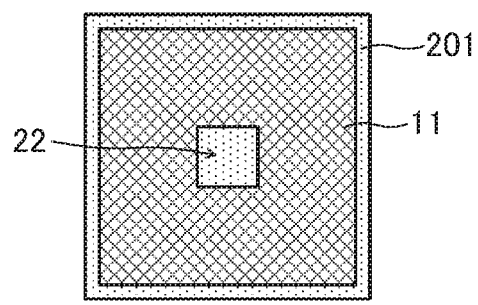

FIG. 2A to FIG. 2C are views for illustrating a semiconductor device 200 according to the second embodiment of the present invention. FIG. 2A is a schematic sectional view for illustrating the semiconductor device 200, FIG. 2B is a plan view for illustrating a front surface side of a semiconductor chip 201 in the semiconductor device 200 illustrated in FIG. 2A, and FIG. 2C is a plan view for illustrating a back surface side of the semiconductor chip 201 in the semiconductor device 200 illustrated in FIG. 2A. In FIG. 2A to FIG. 2C, the same components as those of the semiconductor device 100 according to the first embodiment illustrated in FIG. 1A to FIG. 1C are denoted by the same reference symbols, and redundant description thereof is omitted as appropriate.

As illustrated in FIG. 2A, the semiconductor device 200 according to the second embodiment includes the semiconductor chip 201 in place of the semiconductor chip 101 illustrated in FIG. 1A to FIG. 1C. Further, the interposing film 11 has an opening 22 formed in place of the opening 12 illustrated in FIG. 1A and FIG. 1C.

On a front surface of the semiconductor chip 201, similarly to the semiconductor chip 101 in the first embodiment, the bonding pads 102 and the integrated circuit (not shown) are formed. The integrated circuit includes a plurality of element or circuit sections. Symbol 202 in FIG. 2A and FIG. 2B is an element or circuit section that is most liable to vary in characteristic value due to stress among the element or circuit sections forming the integrated circuit.

The element or circuit section 202 is arranged substantially at the center of the front surface of the semiconductor chip 201 as illustrated in FIG. 2B. The element or circuit section 202 is an element or a circuit that is sensitive to stress, and is, for example, a sensor element, a reference voltage circuit, a bleeder resistor, or a comparator.

The opening 22 is formed at a position overlapping the element or circuit section 202 in plan view in a size capable of surrounding the entire element or circuit section 202.

The opening 22 formed in the interposing film 11 thereby remains as a space between a part of the back surface of the semiconductor chip 201 and the die attach film 103. Stress can thus be released by the opening (space) 22. In addition, an effect similar to that of the semiconductor device 100 according to the first embodiment can be obtained.

Further, according to the semiconductor device 200 of the second embodiment, since the opening 22 is formed in the back surface of the semiconductor chip 201 at a position corresponding to the position of the element or circuit section 202 which is most liable to vary in characteristic value due to stress, and which is formed on the front surface of the semiconductor chip 201, stress applied to the element or circuit section 202, in particular, can be greatly reduced.

As described above, according to the second embodiment, similarly to the first embodiment, the package stress can be reduced, and further the characteristic value variation of the element or the circuit section that is sensitive to stress can be greatly suppressed.

In the second embodiment, there is described an example in which the element or circuit section 202 that is most liable to vary in characteristic value due to stress is arranged substantially at the center of the semiconductor chip 201, but the position of the element or circuit section 202 is not necessarily need to be substantially at the center of the semiconductor chip 201. When it is difficult to arrange the element or circuit section 202 substantially at the center of the semiconductor chip 201 for the reason of layout or the like, the element or circuit section 202 may be arranged at a position other than the center of the semiconductor chip 201. In this case, the opening 22 is also formed at a position overlapping the element or circuit section 202 in plan view, not substantially at the center of the back surface of the semiconductor chip 201. In general, in the vicinity of the center of the semiconductor chip, as compared to a peripheral edge portion of the semiconductor chip, the stress gradient is smaller and the stress is likely to be stable, and hence the element or circuit section 202 is most preferred to be arranged substantially at the center of the semiconductor chip 201 as described in the second embodiment.

Further, in the second embodiment, an example in which the opening 22 has a size capable of surrounding the entire element or circuit section 202, but the opening 22 is only required to overlap at least a part of the element or circuit section 202 in plan view is described. The size of the opening 22 may be smaller than that of the element or circuit section 202. Even though the degree decreases in this case, the above-mentioned effect can be obtained.

Third Embodiment

Figure 3A:
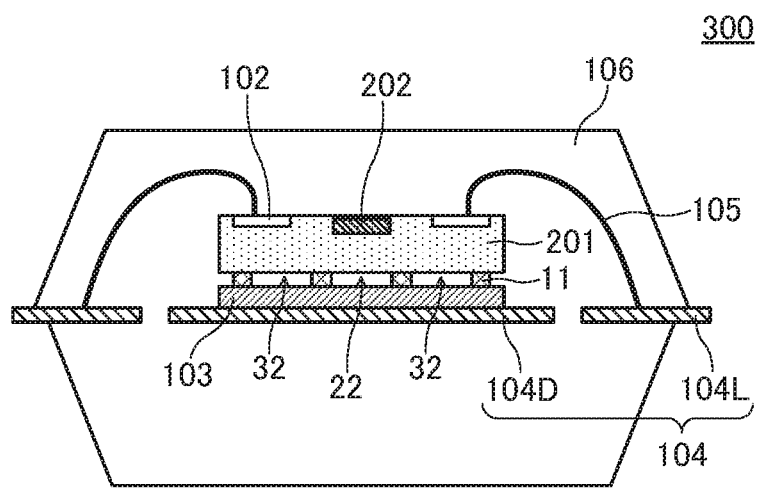
Figure 3B:
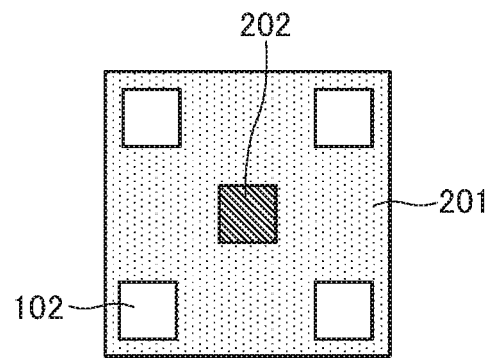
Figure 3C:
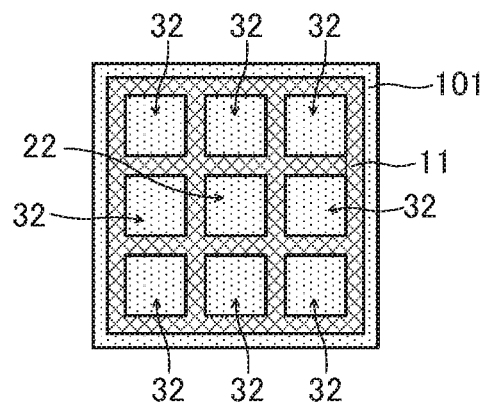

FIG. 3A to FIG. 3C are views for illustrating a semiconductor device 300 according to the third embodiment of the present invention. FIG. 3A is a schematic sectional view for illustrating the semiconductor device 300, FIG. 3B is a plan view for illustrating a front surface side of a semiconductor chip 201 in the semiconductor device 300 illustrated in FIG. 3A, and FIG. 3C is a plan view for illustrating a back surface side of the semiconductor chip 201 in the semiconductor device 300 illustrated in FIG. 3A. In FIG. 3A to FIG. 3C, the same components as those of the semiconductor device 200 according to the second embodiment illustrated in FIG. 2A to FIG. 2C are denoted by the same reference symbols, and redundant description thereof is omitted as appropriate.

As illustrated in FIG. 3A, in the semiconductor device 300 according to the third embodiment, the interposing film 11 has a plurality of openings 32 formed in regions other than the region of the opening 22 illustrated in FIG. 2A and FIG. 2C.

As described above, by the formation of the plurality of openings 22 and 32 in the interposing film 11, the deviation of the stress distribution in the semiconductor chip 201 can be reduced, and the stress gradient in the surface of the semiconductor chip 201 can be decreased. When the stress gradient is large, the variation of the characteristic value of the semiconductor device 300 increases, but according to the third embodiment, the characteristic value variation can be suppressed.

As illustrated in FIG. 3C, in the third embodiment, the opening 22 and the openings 32 have, in particular, substantially the same shape and size, and the plurality of openings 22 and 32 are uniformly arranged so that the interposing film 11 has a grid shape. With this arrangement, the deviation of the stress distribution in the semiconductor chip 201 can be efficiently reduced.

The embodiments of the present invention have been described above, but the present invention is not limited to the above-mentioned embodiments, and it is to be understood that various modifications can be made thereto without departing from the gist of the present invention.

For example, in the above-mentioned embodiments, an example in which the die attach film 103 is used as the adhesive layer for die bonding is described, but the adhesive layer is not limited thereto. That is, as long as the adhesive layer is not a material that enters the opening 12 of the interposing film 11 to fill the opening 12 at the time of die bonding because of the fluidity of the material like the above-mentioned resin paste, a material other than the die attach film can be used as the adhesive layer.

Further, in the third embodiment, an example in which the plurality of openings 22 and 32 are formed in the interposing film 11 when the element or circuit section 202 that is most liable to vary in characteristic value due to stress is formed on the front surface of the semiconductor chip 201 is described, but also in the first embodiment, a plurality of openings can be further formed in addition to the opening 12 in the interposing film 11.

Further, in the above-mentioned embodiments, an example in which the bonding pads 102 are arranged at four corners of each of the semiconductor chips 101 and 201 is described, but the arrangement of the bonding pads 102 is not limited thereto.

What is claimed is:

1. A semiconductor device, comprising:
   a lead frame having a die pad;
   a semiconductor chip having a front surface in which an integrated circuit is formed, and a back surface on which an interposing film is formed, a back surface of the interposing film that is die-bonded onto the die pad by an adhesive layer; and
   an encapsulating resin for encapsulating the lead frame, the adhesive layer, the interposing film, and the semiconductor chip,
   wherein the interposing film has a first opening which forms a space between a part of the back surface of the semiconductor chip and the adhesive layer.

2. The semiconductor device according to claim 1, wherein the adhesive layer is a die attach film.

3. The semiconductor device according to claim 1, wherein, in plan view, the first opening overlaps at least a part of an element or circuit section that is most liable to vary in characteristic value due to stress among element or circuit sections forming the integrated circuit.

4. The semiconductor device according to claim 2, wherein the interposing film has a plurality of second openings formed in regions other than a region of the first opening so that a plurality of spaces is formed between the back surface of the semiconductor chip and the die attach film.

5. The semiconductor device according to claim 1, wherein the interposing film includes any one of polyimide, a silicon oxide film, a silicon nitride film, an alloy containing aluminum as a main component, copper, and polysilicon.

6. The semiconductor device according to claim 2, wherein, in plan view, the first opening overlaps at least a part of an element or circuit section that is most liable to vary in characteristic value due to stress among element or circuit sections forming the integrated circuit.

7. The semiconductor device according to claim 3, wherein the first opening surrounds an entirety of the element or circuit section in plan view.

8. The semiconductor device according to claim 3, wherein the element or circuit section is any one of a sensor element, a reference voltage circuit, a bleeder resistor, and a comparator.

9. The semiconductor device according to claim 3,
wherein the element or circuit section is arranged substantially at a center of the front surface of the semiconductor chip, and
wherein the first opening is formed in the back surface of the semiconductor chip at a position corresponding to a position of the element or circuit section.

10. The semiconductor device according to claim 6, wherein the first opening surrounds an entirety of the element or circuit section in plan view.

11. The semiconductor device according to claim 6, wherein the element or circuit section is any one of a sensor element, a reference voltage circuit, a bleeder resistor, and a comparator.

12. The semiconductor device according to claim 6,
wherein the element or circuit section is arranged substantially at a center of the front surface of the semiconductor chip, and
wherein the first opening is formed in the back surface of the semiconductor chip at a position corresponding to a position of the element or circuit section.

13. The semiconductor device according to claim 9,
wherein the adhesive layer is a die attach film,
wherein the interposing film further has a plurality of second openings having substantially the same shape and substantially the same size as the first opening, the plurality of second openings being formed around the first opening so that a plurality of spaces is formed between the back surface of the semiconductor chip and the die attach film, and
wherein the first opening and the plurality of second openings are uniformly arranged.

14. The semiconductor device according to claim 12,
wherein the interposing film further has a plurality of second openings having substantially the same shape and substantially the same size as the first opening, the plurality of second openings being formed around the first opening so that a plurality of spaces is formed between the back surface of the semiconductor chip and the die attach film, and
wherein the first opening and the plurality of second openings are uniformly arranged.

* * * * *